(12) United States Patent
Benjamin et al.

(10) Patent No.: US 8,631,370 B2
(45) Date of Patent: Jan. 14, 2014

(54) SWAPPING PORTS TO CHANGE THE TIMING WINDOW OVERLAP OF ADJACENT NETS

(75) Inventors: Samuel R. Benjamin, Bangalore (IN); Timothy D. Helvey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/456,591

(22) Filed: Apr. 26, 2012

(65) Prior Publication Data
US 2013/0290921 A1 Oct. 31, 2013

(51) Int. Cl.
*G06F 17/50* (2006.01)

(52) U.S. Cl.
USPC .............................. 716/113; 716/126; 716/132

(58) Field of Classification Search
USPC .......................................... 716/113, 126, 132
See application file for complete search history.

(56) References Cited

U.S. PATENT DOCUMENTS

| | | | |
|---|---|---|---|
| 6,721,312 B2 | 4/2004 | Niu et al. | |
| 7,577,933 B1 * | 8/2009 | Wu et al. ...................... | 716/119 |
| 2003/0185206 A1 | 10/2003 | Jayakrishnan | |
| 2009/0219835 A1 | 9/2009 | Bandholz et al. | |
| 2011/0289468 A1 | 11/2011 | Keinert et al. | |

FOREIGN PATENT DOCUMENTS

| | | |
|---|---|---|
| EP | 1708109 A1 | 10/2006 |
| EP | 2137628 B1 | 6/2011 |

OTHER PUBLICATIONS

Paul S. Zuchowski et al., "A Hybrid ASIC and FPGA Architecture," 0-7803-7607-2-02, IEEE, 2002, pp. 187-194.

* cited by examiner

*Primary Examiner* — Thuan Do
(74) *Attorney, Agent, or Firm* — Owen J. Gamon

(57) ABSTRACT

In an embodiment, a list of ports and a physical location of the ports specified in a circuit design is created. Physically adjacent port pairs are determined within the list of the ports that are physically adjacent. For each respective physically adjacent port pair, the following elements are performed: calculating a timing window overlap for a current port and a next port in the respective physically adjacent port pair, computing a timing window overlap for the current port and each following port that is within a predetermined physical distance, and if the timing window overlap between the respective physically adjacent port pair is not smaller than the timing window overlap for the current port and each following port, swapping a physical location of the adjacent port with a physical location of the following port that has a smallest timing window overlap with the current port.

17 Claims, 5 Drawing Sheets

PORT LIST (156)

| SENDING PORT ID (420) | PHYSICAL LOCATION ID (422) | TIMING WINDOW (424) | TIMING WINDOW OVERLAP (426) | |
|---|---|---|---|---|
| PORT A | 95 MICRONS, 100 MICRONS | 1 NS - 2 NS | 1 NS OVERLAP WITH PORT B, 0 NS OVERLAP WITH PORT C .5 NS OVERLAP WITH PORT D | 402 |
| PORT B | 95 MICRONS, 105 MICRONS | 1 NS - 2 NS | 0 NS OVERLAP WITH PORT C, .5 NS OVERLAP WITH PORT D | 404 |
| PORT C | 95 MICRONS, 110 MICRONS | 2 NS - 3 NS | .5 NS OVERLAP WITH PORT D | 406 |
| PORT D | 95 MICRONS, 115 MICRONS | 1.5 NS - 2.5 NS | | 408 |
| PORT I | 95 MICRONS, 135 MICRONS | 1 NS - 2 NS | | 410 |

FIG. 4

SWAPPING PORTS TO CHANGE THE TIMING WINDOW OVERLAP OF ADJACENT NETS

FIELD

An embodiment of the invention generally relates to designing an electrical circuit via the swapping of ports, in order to change the overlap of timing windows of adjacent nets.

BACKGROUND

Computer systems and other electronic devices typically comprise integrated circuits, which may comprise semiconductors, transistors, wires, programmable logic devices, and programmable gate arrays, and which may be organized into chips, circuit boards, storage devices, and processors, among others.

The automated design of integrated circuits requires specification of a logic circuit by a designer. One technique for physically designing digital integrated logic circuits is known as the standard cell technique, in which physical layouts and timing behavior models are created for simple logic functions such as AND, OR, NOT, or FlipFlop. These physical layouts are known as "standard cells." A large group of pre-designed standard cells is then assembled into a standard cell library. Automated tools read a netlist description of the integrated circuit, or netlist representing the desired logical functionality for a chip (sometimes referred to as a behavioral or register-transfer-level description), and map it into an equivalent netlist composed of standard cells from the selected standard cell library. This process is commonly known as "synthesis."

A netlist is a data structure representation of the electronic logic system that comprises a set of modules, each of which comprises a data structure that specifies sub-components and their interconnection via wires, which are commonly called "nets." The netlist describes the way in which standard cells and blocks are interconnected. Netlists are typically available in VERILOG, EDIF (Electronic Design Interchange Format), or VHDL (Very High Speed Integrated Circuit Hardware Design Language) formats.

Other tools read a netlist comprised of standard cells and create a physical layout of the chip by placing the cells relative to each other to minimize timing delays or wire lengths, then creating electrical connections (or routing) between the cells to physically complete the design of the desired circuit. The design may then be sent to a fabrication vendor that fabrics a chip that implements the circuit (an application-specific integrated circuit or ASIC), or the design may be loaded into a field programmable gate array (FPGA). An FPGA comprises programmable logic components called logic blocks and a hierarchy of reconfigurable interconnects, which allow the blocks to be inter-wired in many different configurations.

SUMMARY

A method, computer-readable storage medium, and computer system are provided. In an embodiment, a list of a plurality of ports and a physical location of the plurality of ports specified in a circuit design is created. A plurality of physically adjacent port pairs are determined within the list of the plurality of ports that are physically adjacent in the circuit design. For each respective physically adjacent port pair within the plurality of physically adjacent port pairs, the following elements are performed: calculating a timing window overlap for a current port and a next port in the respective physically adjacent port pair, computing a timing window overlap for the current port and each following port that is within a predetermined physical distance of the current port, and if the timing window overlap between the respective physically adjacent port pair is not smaller than the timing window overlap for the current port and each following port, swapping a physical location of the adjacent port in the circuit design with a physical location of the following port in the circuit design that has a smallest timing window overlap with the current port.

BRIEF DESCRIPTION OF THE SEVERAL VIEWS OF THE DRAWINGS

FIG. 4 depicts a block diagram of an example data structure for a port list, according to an embodiment of the invention.

It is to be noted, however, that the appended drawings illustrate only example embodiments of the invention, and are therefore not considered a limitation of the scope of other embodiments of the invention.

DETAILED DESCRIPTION

Figure 1:
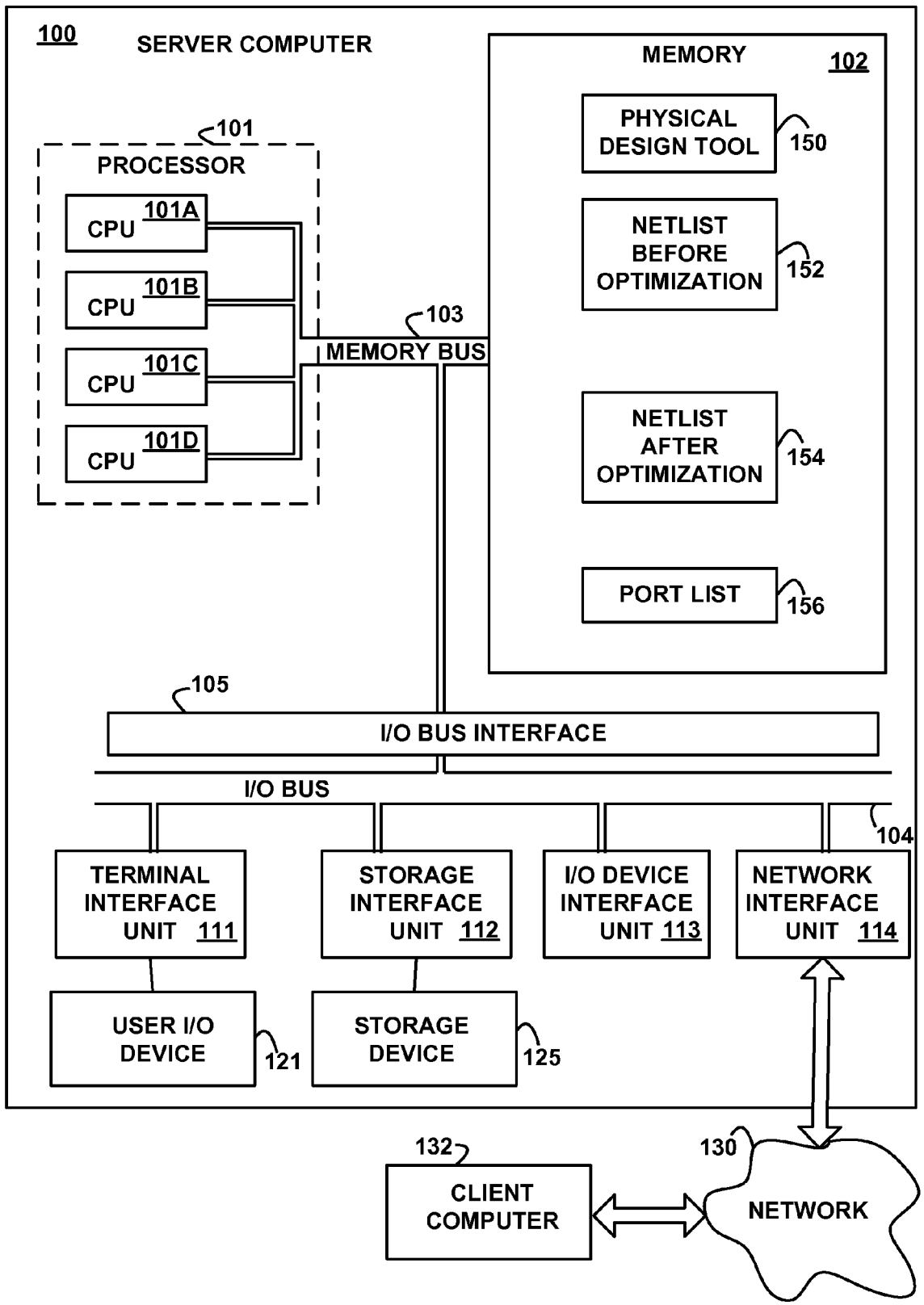
FIG. 1 depicts a high-level block diagram of an example system for implementing an embodiment of the invention.

Referring to the Drawings, wherein like numbers denote like parts throughout the several views, FIG. 1 depicts a high-level block diagram representation of a server computer system 100 connected to a client computer system 132 via a network 130, according to an embodiment of the present invention. The major components of the server computer system 100 comprise one or more processors 101, a memory 102, and interface units 111, 112, 113, and 114, which are communicatively coupled, directly or indirectly, for inter-component communication via a memory bus 103, an I/O (Input/Output) bus 104, and an I/O bus interface 105. The computer system 100 contains one or more general-purpose programmable central processing units (CPUs) 101A, 101B, 101C, and 101D, herein generically referred to as the processor 101. In an embodiment, the computer system 100 contains multiple processors typical of a relatively large system; however, in another embodiment the computer system 100 may alternatively be a single CPU system. Each processor 101 executes instructions stored in the memory 102 and may comprise one or more levels of on-board cache.

In an embodiment, the memory 102 may comprise a random-access semiconductor memory, storage device, or storage medium (either volatile or non-volatile) for storing or encoding data and programs. In another embodiment, the memory 102 represents the entire virtual memory of the computer system 100, and may also include the virtual memory of other computer systems coupled to the computer system 100 or connected via the network 130. The memory 102 is conceptually a single monolithic entity, but in other embodiments the memory 102 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The memory 102 stores or encodes a physical design tool 150, a netlist before optimization 152, a netlist after optimization 154, and a port list 156. Although the physical design tool 150, the netlist before optimization 152, the netlist after optimization 154, and the port list 156 are illustrated as being contained within the memory 102 in the computer system 100, in other embodiments some or all of them may be on different computer systems and may be accessed remotely, e.g., via the network 130. The computer system 100 may use virtual addressing mechanisms that allow the programs of the computer system 100 to behave as if they only have access to a large, single storage entity instead of access to multiple, smaller storage entities. Thus, while the physical design tool 150, the netlist before optimization 152, the netlist after optimization 154, and the port list 156 are illustrated as being contained within the memory 102, these elements are not necessarily all completely contained in the same storage device at the same time. Further, although the physical design tool 150, the netlist before optimization 152, the netlist after optimization 154, and the port list 156 are illustrated as being separate entities, in other embodiments some of them, portions of some of them, or all of them may be packaged together.

In an embodiment, the physical design tool 150 comprises instructions or statements that execute on the processor 101 or instructions or statements that are interpreted by instructions or statements that execute on the processor 101, to carry out the functions as further described below with reference to FIGS. 2, 3, 4 and 5. In another embodiment, the physical design tool 150 is implemented in hardware via semiconductor devices, chips, logical gates, circuits, circuit cards, and/or other physical hardware devices in lieu of, or in addition to, a processor-based system. In an embodiment, the physical design tool 150 comprises data in addition to instructions or statements. In various embodiments, the physical design tool 150 is a user application, a third-party application, an operating system, or any portion, multiple, or combination thereof.

Although the netlist before optimization 152 and the netlist after optimization 154 are illustrated as being separate entities, in another embodiment, the netlist before optimization 152 and the netlist after optimization 154 are the same entity, and the physical design tool 150 optimizes and modifies the netlist in place.

The memory bus 103 provides a data communication path for transferring data among the processor 101, the memory 102, the I/O bus 104, and the I/O bus interface 105.

The interface units 111, 112, 113, and 114 support communication with a variety of storage and I/O devices. For example, the terminal interface unit 111 supports the attachment of one or more user I/O devices 121, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 121 and the computer system 100, and may receive output data via the user output devices. For example, a user interface may be presented via the user I/O device 121, such as displayed on a display device, played via a speaker, or printed via a printer.

The storage interface unit 112 supports the attachment of one or more disk drives or direct access storage devices 125 (which are typically rotating magnetic disk drive storage devices, although they could alternatively be other storage devices, including arrays of disk drives configured to appear as a single large storage device to a host computer). In another embodiment, the storage device 125 may be implemented via any type of secondary storage device. The contents of the memory 102, or any portion thereof, may be stored to and retrieved from the storage device 125, as needed. The I/O device interface unit 113 provides an interface to any of various other input/output devices or devices of other types, such as printers or fax machines. The network interface unit 114 provides one or more communications paths from the computer system 100 to other digital devices and computer systems; such paths may comprise, e.g., one or more networks 130. The other computer systems in the network 130 may comprise some or all of the hardware and program components illustrated for the computer 100.

Although the memory bus 103 is shown in FIG. 1 as a relatively simple, single bus structure providing a direct communication path among the processors 101, the memory 102, the I/O bus 104 and the I/O bus interface 105, in fact the memory bus 103 may comprise multiple different buses or communication paths, which may be arranged in any of various forms, such as point-to-point links in hierarchical, star or web configurations, multiple hierarchical buses, parallel and redundant paths, or any other appropriate type of configuration.

In various embodiments, the computer system 100 is a multi-user mainframe computer system, a single-user system, or a server computer or similar device that has little or no direct user interface, but receives requests from other computer systems (clients). In other embodiments, the computer system 100 is implemented as a desktop computer, portable computer, laptop or notebook computer, tablet computer, pocket computer, telephone, smart phone, pager, automobile, teleconferencing system, appliance, or any other appropriate type of electronic device.

The network 130 may be any suitable network or combination of networks and may support any appropriate protocol suitable for communication of data and/or code to/from the computer system 100 and other computer systems. In various embodiments, the network 130 may represent a storage device or a combination of storage devices, either connected directly or indirectly to the computer system 100. In another embodiment, the network 130 may support wireless communications. In another embodiment, the network 130 may support hard-wired communications, such as a telephone line or cable. In another embodiment, the network 130 may be the Internet and may support IP (Internet Protocol). In another embodiment, the network 130 is implemented as a local area network (LAN) or a wide area network (WAN). In another embodiment, the network 130 is implemented as a hotspot service provider network. In another embodiment, the network 130 is implemented an intranet. In another embodiment, the network 130 is implemented as any appropriate cellular data network, cell-based radio network technology, or wireless network. In another embodiment, the network 130 is implemented as any suitable network or combination of networks. Although one network 130 is shown, in other embodiments any number of networks (of the same or different types) may be present.

The client computer system 132 may comprise some or all of the hardware and program components previously described for the computer system 100.

FIG. 1 is intended to depict the representative major components of the server computer system 100, the network 130, and the client computer system 132. But, individual components may have greater complexity than represented in FIG. 1, components other than or in addition to those shown in FIG. 1 may be present, and the number, type, and configuration of such components may vary. Several particular examples of such additional complexity or additional variations are disclosed herein; these are by way of example only and are not necessarily the only such variations. The various program components illustrated in FIG. 1 and implementing various embodiments of the invention may be implemented in a number of manners, including using various computer applications, routines, components, programs, objects, modules, data structures, etc., and are referred to hereinafter as "computer programs," or simply "programs."

The computer programs comprise one or more instructions or statements that are resident at various times in various memory and storage devices in the computer system 100 and that, when read and executed by one or more processors in the computer system 100 or when interpreted by instructions that are executed by one or more processors, cause the computer system 100 to perform the actions necessary to execute steps or elements comprising the various aspects of embodiments of the invention. Aspects of embodiments of the invention may be embodied as a system, method, or computer program product. Accordingly, aspects of embodiments of the invention may take the form of an entirely hardware embodiment, an entirely program embodiment (including firmware, resident programs, micro-code, etc., which are stored in a storage device) or an embodiment combining program and hardware aspects that may all generally be referred to herein as a "circuit," "module," or "system." Further, embodiments of the invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium, may be, for example, but not limited to, an electronic, magnetic, optical, electromagnetic, infrared, or semiconductor system, apparatus, or device, or any suitable combination of the foregoing. More specific examples (an non-exhaustive list) of the computer-readable storage media may comprise: an electrical connection having one or more wires, a portable computer diskette, a hard disk (e.g., the storage device 125), a random access memory (RAM) (e.g., the memory 102), a read-only memory (ROM), an erasable programmable read-only memory (EPROM) or Flash memory, an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may comprise a propagated data signal with computer-readable program code embodied thereon, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that communicates, propagates, or transports a program for use by, or in connection with, an instruction execution system, apparatus, or device. Program code embodied on a computer-readable medium may be transmitted using any appropriate medium, including but not limited to, wireless, wire line, optical fiber cable, Radio Frequency, or any suitable combination of the foregoing.

Computer program code for carrying out operations for aspects of embodiments of the present invention may be written in any combination of one or more programming languages, including object oriented programming languages and conventional procedural programming languages. The program code may execute entirely on the user's computer, partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of embodiments of the invention are described below with reference to flowchart illustrations and/or block diagrams of methods, apparatus (systems), and computer program products. Each block of the flowchart illustrations and/or block diagrams, and combinations of blocks in the flowchart illustrations and/or block diagrams may be implemented by computer program instructions embodied in a computer-readable medium. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified by the flowchart and/or block diagram block or blocks. These computer program instructions may also be stored in a computer-readable medium that can direct a computer, other programmable data processing apparatus, or other devices to function in a particular manner, such that the instructions stored in the computer-readable medium produce an article of manufacture, including instructions that implement the function/act specified by the flowchart and/or block diagram block or blocks.

The computer programs defining the functions of various embodiments of the invention may be delivered to a computer system via a variety of tangible computer-readable storage media that may be operatively or communicatively connected (directly or indirectly) to the processor or processors. The computer program instructions may also be loaded onto a computer, other programmable data processing apparatus, or other devices to cause a series of operational steps to be performed on the computer, other programmable apparatus, or other devices to produce a computer-implemented process, such that the instructions, which execute on the computer or other programmable apparatus, provide processes for implementing the functions/acts specified in the flowcharts and/or block diagram block or blocks.

The flowchart and the block diagrams in the figures illustrate the architecture, functionality, and operation of possible implementations of systems, methods, and computer program products, according to various embodiments of the present invention. In this regard, each block in the flowcharts or block diagrams may represent a module, segment, or portion of code, which comprises one or more executable instructions for implementing the specified logical function(s). In some embodiments, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flow chart illustrations, can be implemented by special purpose hardware-based systems that perform the specified functions or acts, in combinations of special purpose hardware and computer instructions.

Embodiments of the invention may also be delivered as part of a service engagement with a client corporation, non-profit organization, government entity, or internal organizational structure. Aspects of these embodiments may comprise configuring a computer system to perform, and deploying computing services (e.g., computer-readable code, hardware, and web services) that implement, some or all of the methods described herein. Aspects of these embodiments may also comprise analyzing the client company, creating recommendations responsive to the analysis, generating computer-readable code to implement portions of the recommendations, integrating the computer-readable code into existing processes, computer systems, and computing infrastructure, metering use of the methods and systems described herein, allocating expenses to users, and billing users for their use of these methods and systems. In addition, various programs described hereinafter may be identified based upon the application for which they are implemented in a specific embodiment of the invention. But, any particular program nomenclature that follows is used merely for convenience, and thus embodiments of the invention are not limited to use solely in any specific application identified and/or implied by such nomenclature. The exemplary environments illustrated in FIG. 1 are not intended to limit the present invention. Indeed, other alternative hardware and/or program environments may be used without departing from the scope of embodiments of the invention.

Figure 2:
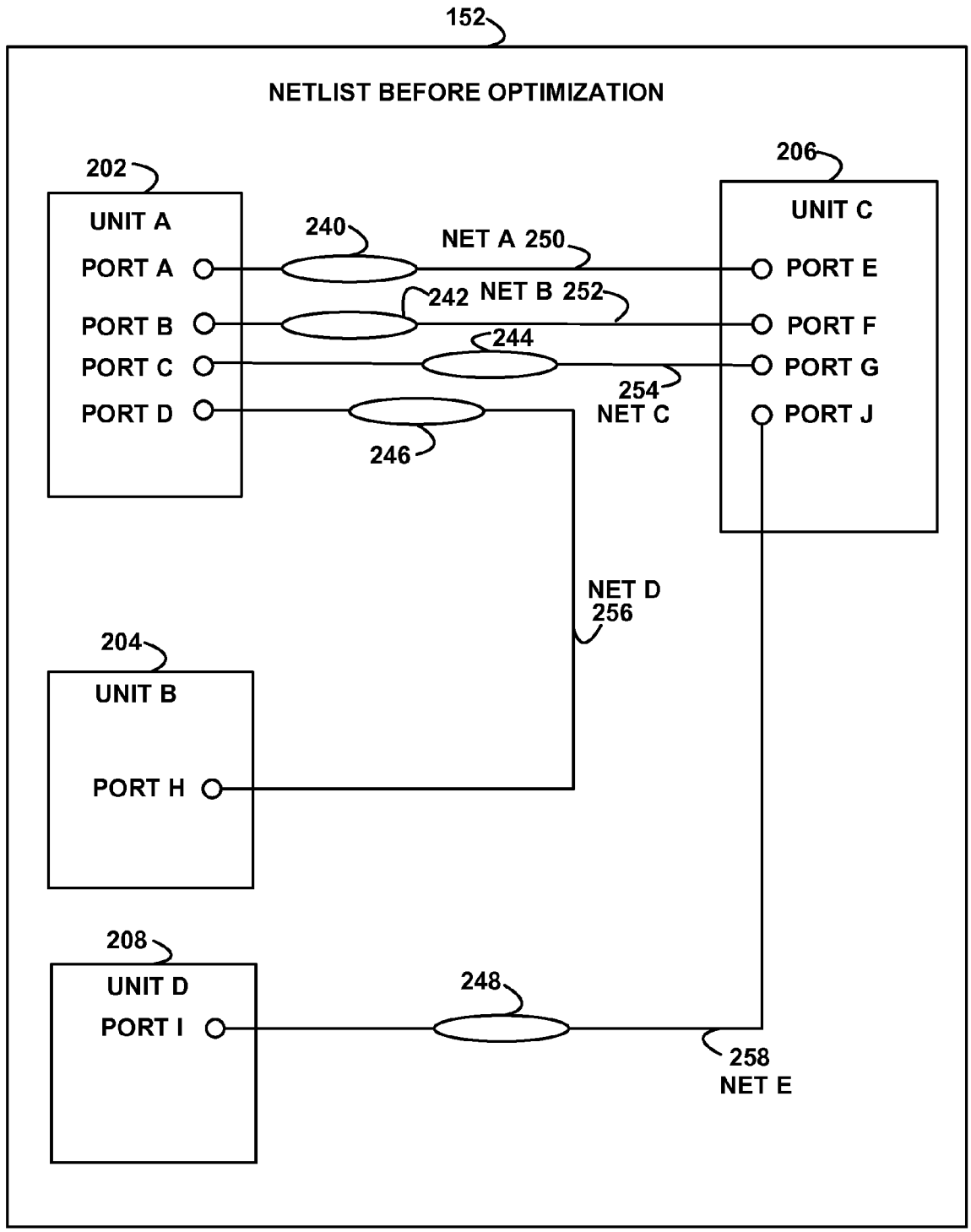
FIG. 2 depicts a block diagram of an example netlist before optimization, according to an embodiment of the invention.

FIG. 2 depicts a block diagram of an example netlist before optimization 152, according to an embodiment of the invention. The netlist 152 comprises data that specifies a circuit design. The netlist 152 comprises a specification of units, such as the example unit A 202, unit B 204, unit C 206, and unit D 208. The units are components, modules, circuits, chips, circuit cards, or other electrical devices. The units comprise ports, e.g., the unit A 202 comprises example sending ports A, B, C, and D; the unit B comprises an example receiving port H; the unit C comprises example receiving ports E, F, G, and J; and the unit D 208 comprises an example sending port I. Thus, each of the units comprises a respective non-intersecting subset of all of the ports specified by the netlist 152. The ports are input or output devices that send or receive electrical signals. In various embodiments, units may comprise sending ports, receiving ports, or sending ports and receiving ports.

The ports of the units 202, 204, 206, and 208 are connected via nets (wires or conducting material) and send or receive signals across the nets. The example nets illustrated are the net A 250, the net B 252, the net C 254, the net D 256, and the net E 258. The net A 250 connects the port A and the port E. The net B 252 connects the port B and the port F. The net C 254 connects the port C and the port G. The net D 256 connects the port D and the port H. The net E 258 connects the port I and the port J. A sending port sends an electrical signal to a receiving port that is connected to the sending port via a net.

The port A is physically adjacent to the port B, which is physically adjacent to the port C, which is physically adjacent to the port D. The port D is not physically adjacent to the port H, and the port H is not physically adjacent to the port I. In an embodiment, two physically adjacent ports have no intervening port. In another embodiment, two physically adjacent ports have no intervening port and are located within a defined minimum spacing or have a minimum distance between them.

The netlist 152 further specifies a timing window 240 of the net A 250, a timing window 242 of the net B 252, a timing window 244 or the net C 254, a timing window 246 of the net D 256, and a timing window 248 of the net E 258.

The timing window for a net represents the time that a signal is active on the net. A timing window is demarcated by a beginning elapsed time offset from a most recent clock signal edge and an ending elapsed time offset from the most recent clock signal edge. The beginning elapsed time offset comprises an earliest possible time that a signal edge transitions (from non-active to active) from the sending port that connects to the net. The ending elapsed time offset comprises a latest possible time that a signal edge transitions (from active to non-active) from the sending port that connects to the net. A signal edge is a transition in a digital signal from either a low value (below a threshold value) of voltage or current to a high value (above a threshold value) of voltage or current or high to low. The term "edge" is used because the square wave that represents a signal has edges at those points. The levels of the digital signal represent the binary integers or logic levels of 0 and 1. In various embodiments, the logic of the circuit specified by the netlist may be active-high or active-low. In active-high logic, low represents binary 0 and high represents binary 1. Active-low logic uses the reverse representation.

One or more of the units is a clock. In embodiment, the clock is implemented by a resonant circuit, such as a crystal oscillator or a quartz piezo-electric oscillator, and an amplifier that inverts the signal from the resonant circuit and feeds a portion back into the resonant circuit, in order to maintain oscillation. A clock generates clock signals (also known as timing signals), which are digital signals used to synchronize digital circuits. The clock signal oscillates between a high and a low state, analogous to a metronome. In an embodiment, the clock signal is in the form of a square wave with a 50% duty cycle and has a fixed, constant frequency. Logic changes in the circuit specified by the netlist are triggered either by the rising edge, the falling edge, or both the rising and falling edges of the clock signal.

Two adjacent timing windows overlap if the beginning elapsed time offset of a first timing window is greater than the beginning elapsed time offset of a second timing window and less than the ending elapsed time offset of the second timing window, the ending elapsed time offset of the first timing window is greater than the ending elapsed time offset of the second timing window, and the physical design tool 150 calculates the amount of the timing window overlap to be the ending elapsed time offset of the second timing window minus the beginning elapsed time offset of the first timing window. Two adjacent timing windows also overlap if the ending elapsed time offset of a first timing window is greater than the beginning elapsed time offset of a second timing window and less than ending elapsed time offset of the second timing window, and the beginning elapsed time offset of the first timing window is less than the beginning time offset of the second timing window, and the physical design tool 150 calculates the amount of the timing window overlap to be the ending elapsed time offset of the first timing window minus the beginning elapsed time offset of the second timing window. Two adjacent timing windows also overlap if their respective beginning elapsed time offsets are identical and their respective ending time offsets are identical, and the physical design tool 150 calculates the amount of the timing window overlap to be the ending time offset of either timing window minus the beginning time offset of either timing window. Two adjacent timing windows also overlap if the beginning elapsed time offset of a first timing window is less than the beginning elapsed time offset of a second timing window and the ending elapsed time offset of the first timing window is greater than the ending elapsed time offset of the second timing window, and the physical design tool 150 calculates the amount of the timing window overlap to be the duration of the second timing window (the ending elapsed time offset of the second timing window minus the beginning elapsed time offset of the second timing window). For example, as illustrated in FIG. 2, the adjacent timing windows 240 and 242 overlap, and the adjacent timing windows 244 and 246 overlap.

If the ending elapsed time offset of the first timing window is less than or equal to the beginning elapsed time offset of the second timing window, then the first and second timing windows do not overlap (the physical design tool 150 calculates the amount of overlap to be zero). Similarly, if the beginning elapsed time offset of the first timing window is greater than or equal to the ending elapsed time offset of the second timing window, then the first and second timing windows do not overlap. For example, as illustrated in FIG. 2, the adjacent timing windows 242 and 244 do not overlap.

In an embodiment, the physical design tool 150 determines the timing windows via Static Timing Analysis (STA), which calculates delays of circuits in the units and determines the earliest and latest times that signal transitions can possibly occur. In an embodiment, the STA uses a Critical Path Method (CPM) to traverse a graph representing the circuit specified by the netlist. The critical path is the path between an input and an output with a maximum delay. In an embodiment, the STA finds the critical path via a traceback method.

Figure 3:
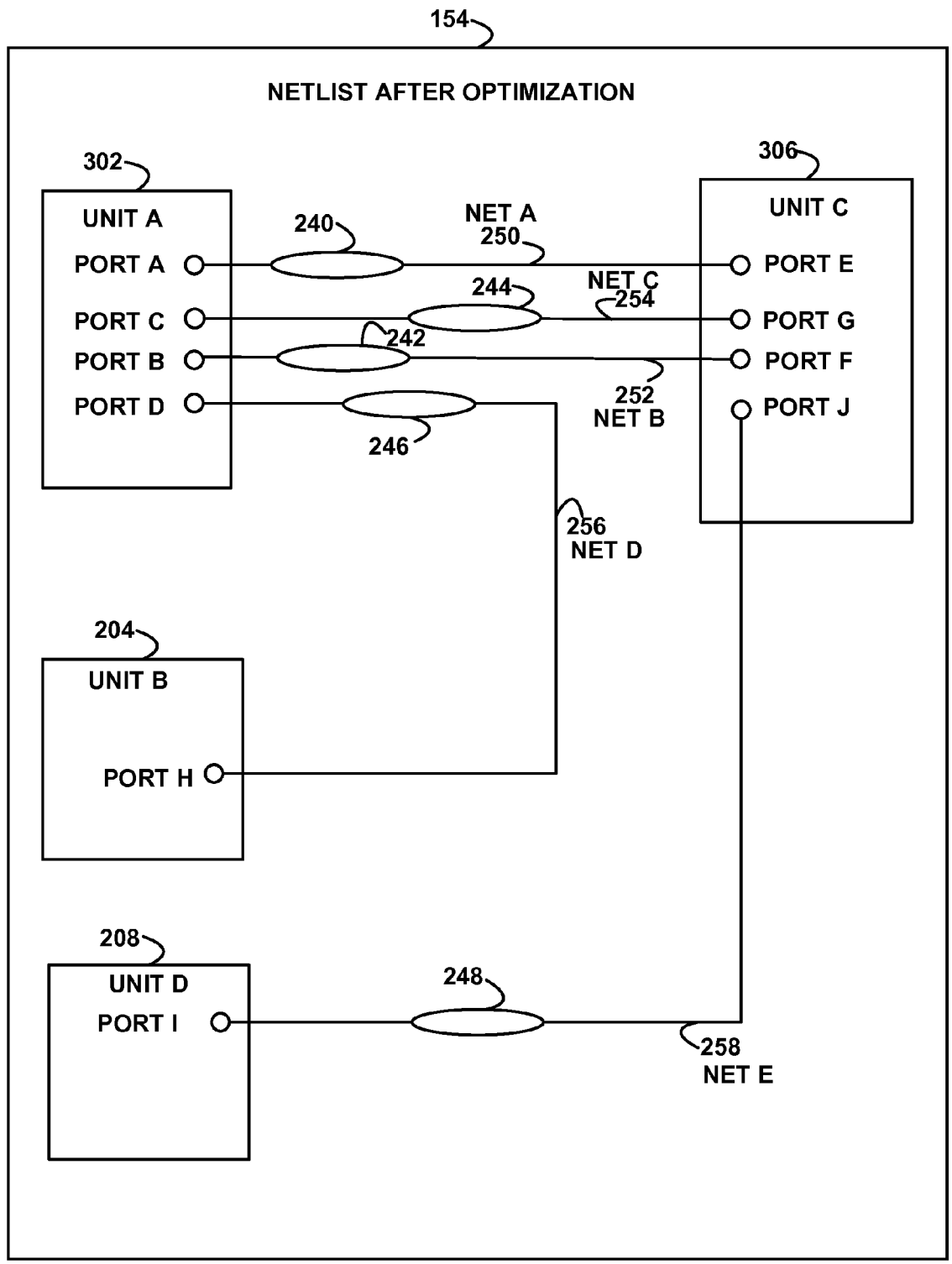
FIG. 3 depicts a block diagram of an example netlist after optimization, according to an embodiment of the invention.

FIG. 3 depicts a block diagram of an example netlist after optimization 154, according to an embodiment of the invention. The netlist 154 comprises data that specifies a circuit design. The netlist 154 comprises a specification of units, such as the example unit A 302, unit B 204, unit C 306, and unit D 208. The units comprise ports, e.g., the unit A 302 comprises example sending ports A, C, B, and D; the unit B 204 comprises an example receiving port H; the unit C 306 comprises example receiving ports E, G, F, and J; and the unit D 208 comprises an example sending port I.

The ports of the units are connected via nets (wires or conducting material) and send or receive signals across the nets. The example nets illustrated are the net A 250, the net B 252, the net C 254, the net D 256, and the net E 258. The net A 250 connects the port A and the port E. The net B 252 connects the port B and the port F. The net C 254 connects the port C and the port G. The net D 256 connects the port D and the port H. The net E 258 connects the port I and the port J.

The port A is physically adjacent to the port C, which is physically adjacent to the port B, which is physically adjacent to the port D. The netlist 152 further specifies a timing window 240 of the net A 250, a timing window 244 of the net C 254, a timing window 242 or the net B 252, a timing window 246 of the net D 256, and a timing window 248 of the net E 258. The physical design tool 150 swapped the physical locations of the port B and port C from the locations in the unit A 202 of the netlist 152 of FIG. 2 to create the unit A 302 of the netlist 154 of FIG. 3. The physical design tool 150 further swapped the physical locations of the port F and the port G from the locations in the unit C 206 of the netlist 152 of FIG. 2 to create the unit C 306 in the netlist 154 of FIG. 3. In FIG. 2, the timing window 242 completely overlapped with the adjacent timing window 240, but in FIG. 3, the swapping of the port B with the port C and the port F with the port G has caused the timing window 242 to no longer overlap at all with the timing window 240 (because their ports are no longer physically adjacent); instead, in FIG. 3, the timing window 242 only partially overlaps with the timing window 246. Further, in FIG. 2, the timing window 244 partially overlapped with the timing window 246, but in FIG. 3, swapping the port B with the port C and the port F with the port G has caused the timing window 244 to no longer overlap at all with any other timing window.

Thus, by swapping or switching the physical locations of the sending port B with the sending port C and the receiving port F with the receiving port G, the physical design tool 150 has decreased the total timing window overlap between adjacent ports specified by the circuit design of the netlist, which reduces the probability of coupling between adjacent nets in the circuit after fabrication, thus reducing the probability of timing errors in the fabricated circuit specified by the netlist 154, as opposed to a fabricated circuit specified by the netlist 152. The coupling capacitance of adjacent nets causes each signal in the nets to have an effect on its neighbors. If the timing of signal transitions on two adjacent wires is similar, then the coupling effects can speed up or slow down the propagation of a signal through the wire, causing timing errors in the circuit.

FIG. 4 depicts a block diagram of an example data structure for a port list 156, according to an embodiment of the invention. The port list comprises example entries, such as the entries 402, 404, 406, 408, and 410, each of which comprises an example sending port identifier (ID) field 420, a physical location identifier (ID) field 422, a timing window field 424, and a timing window overlap field 426.

The sending port identifier field 420, in each entry, identifies a respective sending port in the netlist 152. In another embodiment, the port list 156 comprises a receiving port identifier field that identifies a respective receiving port.

The physical location ID field 422, in each entry, identifies the physical location in a circuit of the port identified by the sending port identifier field 420, in the same entry. In an embodiment, the physical location ID field 422 specifies the locations of ports on a grid or a Cartesian coordinate system with an x-axis component and a y-axis component. The x-axis component and the y-axis component specify respective horizontal and vertical offsets from a reference point, such as the upper left-hand corner of the grid. For example, the sending port identifier field 420 and the physical location ID field 422 in the entry 402 specify that the port A is located 95 microns horizontally and 100 microns vertically from the reference point, but in other embodiments, any appropriate physical specification system and units of measure may be used.

The physical design tool 150 sorts the entries in the port list 156 by the values in the physical location ID field 422. In an embodiment, the physical design tool 150 sorts the entries, in ascending order, by the x-axis component of the physical location ID field 422, ignoring the y-axis component. In an embodiment, the physical design tool 150 sorts the entries, in ascending order, by the y-axis component of the physical location ID field 422, ignoring the x-axis component. In an embodiment, the physical design tool 150 sorts the entries, in ascending order, using the x-axis component of the physical location ID field 422 as a primary key and the y-axis component as a secondary key. In an embodiment, the physical design tool 150 sorts the entries, in ascending order, using the y-axis component of the physical location ID field 422 as a primary key and the x-axis component as a secondary key.

The timing window field 424, in each entry, identifies an amount of time that timing windows overlap, specified by a beginning elapsed time offset from a most recent clock signal edge and an ending elapsed time offset from the most recent clock signal edge of the signal sent by the sending port identified by the sending port identifier field 420, in the same entry. Although FIG. 4 illustrates units of measure of nanoseconds (ns), in other embodiments any appropriate units of measure may be used.

The timing window overlap field 426, in each entry, identifies the amount of timing window overlap between the timing window of the signals sent by the sending port 420, in the same entry, and the timing windows of following ports (within the sorted order of the entries) whose physical location is within a specified distance of the sending port 420. For example, if the specified distance is 15 microns, then the timing window overlap field 426 in the entry 402 identifies the amount of timing window overlap with the port B, the port C, and the port D because these ports are all within 15 microns of the location of the port A. But, the timing window overlap field 426 in the entry 402 does not specify an amount timing window overlap of the port A with the port I because the physical location of the port I is more than 15 microns from the physical location of the port A.

Figure 5:
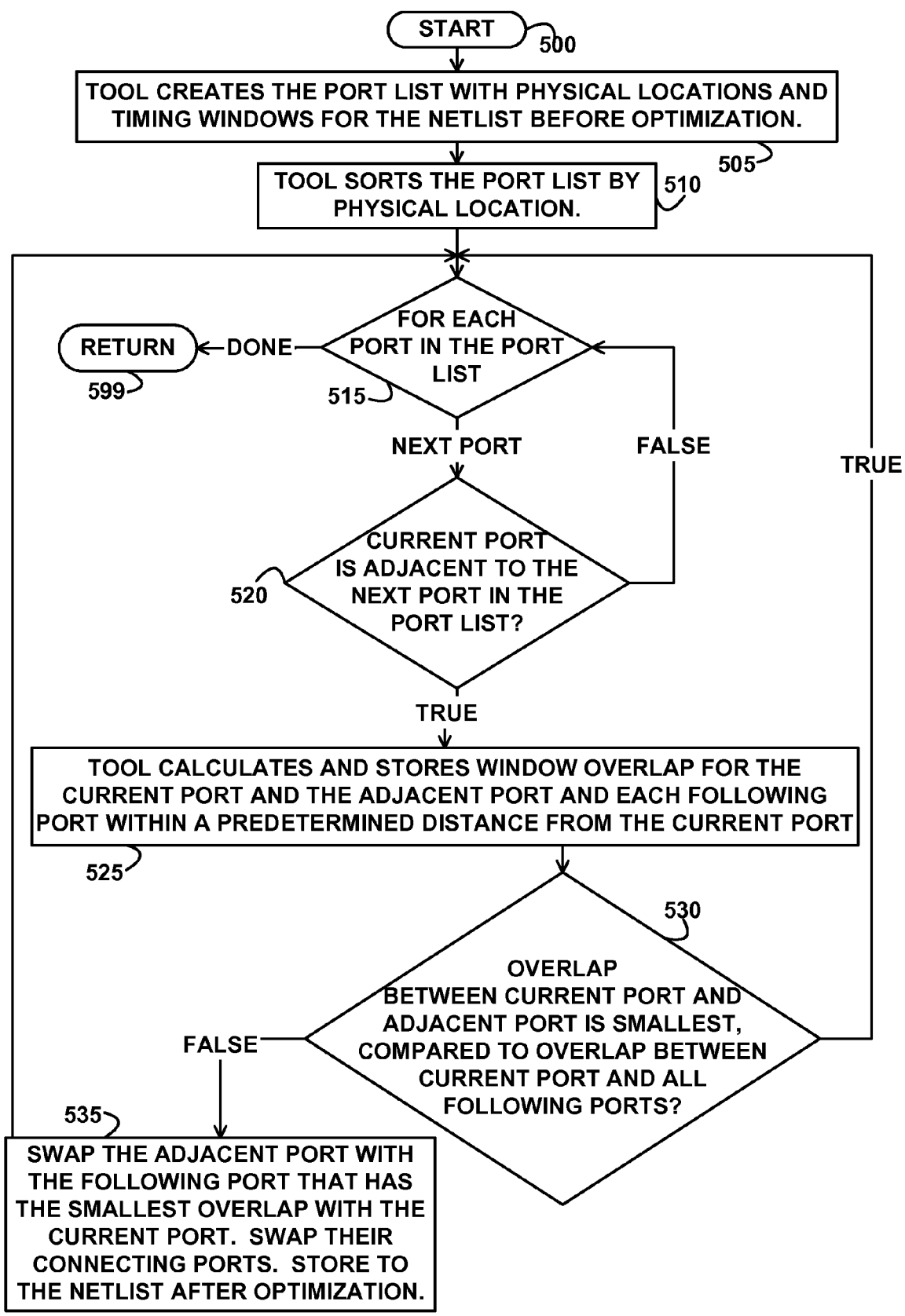
FIG. 5 depicts a flowchart of example processing for optimizing locations of ports, according to an embodiment of the invention.

FIG. 5 depicts a flowchart of example processing for optimizing locations of ports, according to an embodiment of the invention. Control begins at block 500. Control then continues to block 505 where the physical design tool 150 reads the netlist before optimization 152, creates the port list 156, determines the physical locations of the units in the netlist, determines the timing windows for the units, and stores the port identifiers, the physical location IDs, and the timing windows to the port list 156. Control then continues to block 510 where the physical design tool 150 sorts the entries in the port list 156 by the physical locations.

Control then continues to block 515 where the physical design tool 150 begins a loop that executes once for each port identifier (each entry in the port list 156). So long as an entry remains in the port list 156 that is unprocessed by the loop, the physical design tool 150 sets the current port identifier to be the next unprocessed port identifier in the port list 156 and continues from block 515 to block 520, where the physical design tool 150 determines whether the current port is physically adjacent to the next port (from the current port) in the sorted port list 156, including being within or less than a predefined distance, a specified distance, or a minimum distance from the next port in the sorted port list 156.

If the determination at block 520 is true, then the current port is physically adjacent to the next port (from the current port) in the sorted port list 156, so control continues to block 525 where the physical design tool 150 calculates and stores the timing window overlap 426 for the current port and the adjacent port and each following port after the current port in the port list 156 that is within a predetermined distance or specified distance from the current port.

Control then continues to block 530 where the physical design tool 150 determines whether the amount of the timing window overlap between the current port and the adjacent port is the smallest or the minimum, as compared to the timing window overlap 426 between the current port and all the following ports (following the current port) in the port list 156 that are within a specified distance from the current port.

If the determination at block 530 is true, then the amount of the timing window overlap between the current port and the adjacent port is the smallest, as compared to the amounts of the timing window overlap between the current port and all following ports within a specified distance from the current port, so processing for the current port by the loop is complete, and control returns to block 515, as previously described above.

If the determination at block 530 is false, then the amount of the timing window overlap between the current port and the adjacent port is not the smallest, as compared to the amounts of the timing window overlap between the current port and all following ports within a specified distance from the current port, and at least one of the following ports has an amount of timing window overlap with the current port that is smaller than the amount of the timing window overlap between the current port and the adjacent port, so control continues to block 535 where the physical design tool 150 swaps the adjacent port with the following port that has the smallest overlap with the current port. The physical design tool 150 further swaps the port that is connected to the adjacent port via a net with the port that is connected to the following port that has the smallest overlap with the current port. (For example, if the adjacent port and the following port are sending ports, the physical design tool 150 also swaps their respective connected receiving ports.) The physical design tool 150 stores a specification of the swapped ports and their locations to the netlist after optimization 154. Control then returns to block 515, as previously described above.

If the determination at block 520 is false, then the current port is not physically adjacent to the next port in the port list 156, and the current port has now been processed by the loop, so control returns to block 515, where the physical design tool 150 continues reading and processing each port in the port list 156, as previously described above. Thus, the loop that starts at block 520 determines a plurality of physically adjacent port pairs within the port list 156 that are physically adjacent in the circuit design specified by the netlist 152.

After all ports in the port list 156 have been processed by the loop that starts at block 515, control continues from block 515 to block 599 where the logic of FIG. 5 returns.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the invention, reference was made to the accompanying drawings (where like numbers represent like elements), which form a part hereof, and in which is shown by way of illustration specific exemplary embodiments in which the invention may be practiced. These embodiments were described in sufficient detail to enable those skilled in the art to practice the invention, but other embodiments may be utilized and logical, mechanical, electrical, and other changes may be made without departing from the scope of the present invention. In the previous description, numerous specific details were set forth to provide a thorough understanding of embodiments of the invention. But, embodiments of the invention may be practiced without these specific details. In other instances, well-known circuits, structures, and techniques have not been shown in detail in order not to obscure embodiments of the invention.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure is not necessary. The previous detailed description is, therefore, not to be taken in a limiting sense.

What is claimed is:

1. A computer-implemented method comprising:
creating a list of a plurality of ports and a physical location of the plurality of ports specified in a circuit design;
determining a plurality of physically adjacent port pairs within the list of the plurality of ports that are physically adjacent in the circuit design; and
for each respective physically adjacent port pair within the plurality of physically adjacent port pairs, performing
calculating a timing window overlap for a current port and a next port in the respective physically adjacent port pair, wherein the respective physically adjacent port pair comprises the current port and the next port,
computing a timing window overlap for the current port and each following port that is within a predetermined physical distance of the current port, and
if the timing window overlap between the respective physically adjacent port pair is not smaller than the timing window overlap for the current port and each following port, swapping a physical location of the adjacent port in the circuit design with a physical location of the following port in the circuit design that has a smallest timing window overlap with the current port, wherein the timing window overlap for the current port and the next port comprises an amount of time where the current port and the next port are active at a same time.

2. The method of claim 1, wherein the performing further comprises:
if the timing window overlap for the current port and the next port is smallest compared to the timing window overlap for the current port and each following port, refraining from the swapping; and
if the timing window overlap between the physically adjacent port pairs is not smaller than the timing window overlap for the current port and each following port, swapping a physical location of a port that is connected to the adjacent port in the circuit design with a physical location of a port that is connected to the following port in the circuit design that has the smallest timing window overlap.

3. The method of claim 1, wherein the timing window overlap comprises an overlap of a current timing window of the current port and a next timing window of the next port, wherein the current timing window comprises a current beginning elapsed time offset from a most recent clock signal edge and a current ending elapsed time offset from the most recent clock signal edge, and wherein the next timing window comprises a next beginning elapsed time offset from the most recent clock signal edge and a next ending elapsed time offset from the most recent clock signal edge.

4. The method of claim 3, wherein the current beginning elapsed time offset comprises an earliest possible time that a signal transitions from the current port.

5. The method of claim 3, wherein the current ending elapsed time offset comprises a latest possible time that a signal transitions from the current port.

6. The method of claim 1, wherein the plurality of ports comprise sending ports that send signals.

7. The method of claim 1, wherein the plurality of ports comprise receiving ports that receive signals.

8. A non-transitory computer-readable storage medium encoded with instructions, wherein the instructions when executed comprise:
creating a list of a plurality of ports and a physical location of the plurality of ports specified in a circuit design;
determining a plurality of physically adjacent port pairs within the list of the plurality of ports that are physically adjacent in the circuit design; and
for each respective physically adjacent port pair within the plurality of physically adjacent port pairs, performing
calculating a timing window overlap for a current port and a next port in the respective physically adjacent port pair, wherein the respective physically adjacent port pair comprises the current port and the next port,
computing a timing window overlap for the current port and each following port that is within a predetermined physical distance of the current port,
if the timing window overlap between the respective physically adjacent port pair is not smaller than the timing window overlap for the current port and each following port, swapping a physical location of the adjacent port in the circuit design with a physical location of the following port in the circuit design that has a smallest timing window overlap with the current port,
if the timing window overlap for the current port and the next port is smallest compared to the timing window overlap for the current port and each following port, refraining from the swapping, and
if the timing window overlap between the physically adjacent port pairs is not smaller than the timing window overlap for the current port and each following port, swapping a physical location of a port that is connected to the adjacent port in the circuit design with a physical location of a port that is connected to the following port in the circuit design, wherein the timing window overlap for the current port and the next port comprises an amount of time where the current port and the next port are active at a same time.

9. The non-transitory computer-readable storage medium of claim 8, wherein the timing window overlap comprises an overlap of a current timing window of the current port and a next timing window of the next port, wherein the current timing window comprises a current beginning elapsed time offset from a most recent clock signal edge and a current ending elapsed time offset from the most recent clock signal edge, and wherein the next timing window comprises a next beginning elapsed time offset from the most recent clock signal edge and a next ending elapsed time offset from the most recent clock signal edge.

10. The non-transitory computer-readable storage medium of claim 9, wherein the current beginning elapsed time offset comprises an earliest possible time that a signal transitions from the current port.

11. The non-transitory computer-readable storage medium of claim 9, wherein the current ending elapsed time offset comprises a latest possible time that a signal transitions from the current port.

12. The non-transitory computer-readable storage medium of claim 8, wherein the plurality of ports comprise sending ports that send signals.

13. The non-transitory computer-readable storage medium of claim 8, wherein the plurality of ports comprise receiving ports that receive signals.

14. A computer comprising:
a processor; and memory communicatively coupled to the processor, wherein the memory is encoded with instructions, and wherein the instructions when executed by the processor comprise creating a list of a plurality of ports and a physical location of the plurality of ports specified in a circuit design, wherein the circuit design comprises a specification of a plurality of units, and wherein each of the plurality of units comprises a respective subset of the plurality of the ports;

determining a plurality of physically adjacent port pairs within the list of the plurality of ports that are physically adjacent in the circuit design; and for each respective physically adjacent port pair within the plurality of physically adjacent port pairs, performing calculating a timing window overlap for a current port and a next port in the respective physically adjacent port pair, wherein the timing window overlap for the current port and the next port comprises an amount of time where the current port and the next port are active at a same time, wherein the respective physically adjacent port pair comprises the current port and the next port, computing a timing window overlap for the current port and each following port that is within a predetermined physical distance of the current port, if the timing window overlap between the respective physically adjacent port pair is not smaller than the timing window overlap for the current port and each following port, swapping a physical location of the adjacent port in the circuit design with a physical location of the following port in the circuit design that has a smallest timing window overlap with the current port, if the timing window overlap for the current port and the next port is smallest compared to the timing window overlap for the current port and each following port, refraining from the swapping, and if the timing window overlap between the physically adjacent port pairs is not smaller than the timing window overlap for the current port and each following port, swapping a physical location of a port that is connected to the adjacent port in the circuit design with a physical location of a port that is connected to the following port in the circuit design, wherein the timing window overlap comprises an overlap of a current timing window of the current port and a next timing window of the next port, wherein the current timing window comprises a current beginning elapsed time offset from a most recent clock signal edge and a current ending elapsed time offset from the most recent clock signal edge, and wherein the next timing window comprises a next beginning elapsed time offset from the most recent clock signal edge and a next ending elapsed time offset from the most recent clock signal edge.

15. The computer of claim 14, wherein the current beginning elapsed time offset comprises an earliest possible time that a signal transitions from the current port, and wherein the current ending elapsed time offset comprises a latest possible time that a signal transitions from the current port.

16. The computer of claim 14, wherein the plurality of ports comprise sending ports that send signals.

17. The computer of claim 14, wherein the plurality of ports comprise receiving ports that receive signals.

* * * * *